United States Patent [19]

Ortega

[11] Patent Number: 5,492,479
[45] Date of Patent: Feb. 20, 1996

[54] ELECTRICAL CONNECTOR ORGANIZER AND BOARD STIFFENER APPARATUS

[75] Inventor: Jose L. Ortega, Louisville, Ky.

[73] Assignee: Robinson Nugent, Inc., New Albany, Ind.

[21] Appl. No.: 239,992

[22] Filed: May 9, 1994

[51] Int. Cl.$^6$ .................................................. H01R 23/70
[52] U.S. Cl. ............................................. 439/79; 439/951
[58] Field of Search .............................. 439/79, 80, 892, 439/893, 571–573

[56] References Cited

U.S. PATENT DOCUMENTS

| | | | |
|---|---|---|---|
| 3,977,522 | 8/1976 | van der Aker et al. | 206/330 |
| 4,428,640 | 1/1984 | Pittman | 439/79 |
| 5,401,187 | 3/1995 | Ortega | 439/567 |

OTHER PUBLICATIONS

"HDM/HDM$^{Plus}$ 2mm Backplane Interconnection System", Teradyne, Inc. catalog, pp. 1–8, 1993.
"Introducing DuPont Metral. The Universal Interconnection System", DuPont Electronics advertisement, two pages, date unknown.
"Backpanel Connectors—Metral™Board Stiffener", DuPont Connector Systems catalog, pp. 10–22 and 10–23, date unknown.
"The Universal Stiffener™", Compufab, Inc. catalog, two pages, date unknown.
"IEC 1076-4-001 Specification 48B.38.1", 64 pages, Nov. 1993.

*Primary Examiner*—Neil Abrams
*Attorney, Agent, or Firm*—Barnes & Thornburg

[57] ABSTRACT

An apparatus (50) is configured to be positioned between an electrical connector (32) and a printed circuit board (14) to strengthen the printed circuit board (14). The electrical connector (32) has at least one location peg (44) extending therefrom for aligning the electrical connector (32) relative to the printed circuit board (14). The apparatus (50) includes a generally L-shaped body member having a first leg (54) configured to abut an end edge (63) of the printed circuit board (14) and a second leg (56) configured to abut a surface of the printed circuit board (14) adjacent the end edge (63). The second leg (56) is formed to include at least one aperture (60) for receiving the at least one location peg (44) of the electrical connector (32) therein to couple electrical connector (32) to the body member. Preferably, the printed circuit board (14) is formed to include a notched portion (52) adjacent the end edge (63). The second leg (56) of the L-shaped body member is configured to lie within the notched portion (52).

17 Claims, 2 Drawing Sheets

ELECTRICAL CONNECTOR ORGANIZER AND BOARD STIFFENER APPARATUS

BACKGROUND AND SUMMARY OF THE INVENTION

The present invention relates to an electrical connector organizer and printed circuit board stiffener. More particularly, the present invention relates to a connector organizer and board stiffener that permits use of two piece modular connector assembly without using valuable printed circuit board real estate.

The current industry standard for a two part modular connector system for electrically coupling a backplane to a daughtercard is set in the United States by specification EIA/IS-64 from Electronic Industries Association. This specification sets out parameters for 2 mm, two-part connectors for use printed with circuit boards and backplanes. The international standard for such two-part connectors is set forth in IEC 1076-4-001 specification 48B.38.1. Both of these specifications define a daughtercard connector (free board connector) that includes female receptacle contacts and a backplane or motherboard connector (fixed board connector) that contains male pin contacts. A connector that contains female receptacle contacts is commonly referred to as a "socket" connector, and a connector that contains male pin contacts is commonly referred to as a "header" connector.

The present invention relates to a high density backplane interconnect system that incorporates a printed circuit board ("PCB") support structure. This PCB support structure (hereinafter referred to as a "board stiffener") is considered necessary to prevent bow or misalignment problems that often arise with very long PCB edge style connectors. These alignment problems are most often the result of differences in component thermal expansions. When heated during the soldering phase, the thermoplastic housing material of the connector usually expands at a higher rate that the PCB. The PCB is made from a composite of fiberglass/epoxy resin plus copper traces with plated through holes or pads. Due to built in residual stresses that accumulate during manufacture and assembly of both PCBs and connectors and are subsequently "released" with the application of heat, the components often do not return to their initial alignments after cooling. The relatively rigid metallic contact leads extending from the connector housing are mechanically attached to a pad or a plated through hole on the PCB during the solder phase, then become highly stressed as they are forced to compensate for a misalignment between the PCB and the connector. Being more rigid than the PCB (usually), the thermoplastic housing body of the connector effectively forces the PCB to conform to its new position via the "pull" effect it generates through the contact leads, causing PCB to bow and/or warp. On longer connectors these alignment differences are even more magnified and cause greater problems. For some high end applications, the overall connector length can be well over 10 inches long. Accordingly, the industry often insists on a board stiffener alongside the connector to reduce these undesirable effects.

Traditional board stiffeners consist of a metallic shell or U-shaped bar that is bolted or screwed down to the PCB. In other instances, the board stiffener is also physically attached to the connector. Such board stiffeners are usually made from a metallic material. Because of the much stronger stiffness of the metallic stiffener material compared to the plastic housing or PCB, the stiffener greatly reduces the warp or bow effects between the components. Some problems exist with conventional board stiffeners. These problems include increased board real estate requirements (a major problem in high density packaging applications), and increased assembly costs.

Additionally, on high end backplane systems that require large PCB's and high density motherboard—daughtercard connectors, there is a customer desire for a one housing "long" edge connector solution to facilitate inventory and assembly. However, from a connector supplier's perspective, the manufacture of high density very long connectors is extremely difficult and costly. Due to increased plastic shrinkage effects and very demanding mold flow requirements, the tooling costs to make large quantities of high precision "long and flat" plastic parts as required for microelectronic connector applications, becomes very expensive. Given that different potential customers have different quantities of signal I/O connector requirements, the cost of tooling dedicated high density "long and flat" connectors for each customer application becomes prohibitive.

In an effort to address varying customer applications with a coherent, single connector interface approach, most backplane two-piece connector manufacturers have developed "modular", end-to-end stackable designs. These modular end-to-end stackable designs allowed customers to mix and match several different sized modules to fit their particular application. See, for example, the IEC 48B.38.1 specification discussed above.

The development of the subject invention was undertaken to provide a connector organizer and board stiffener for high density motherboard—daughtercard style applications with a single piece (two pieces total for a mated set) "long and flat" connector. The IEC refers to a motherboard or backplane as a "fixed board" and a daughtercard as a "free board". In addition, the present invention provides a board stiffener that does not increase PCB board real estate requirements or increase customer's component-to-PCB assembly costs. The present invention also provides a system that addresses the one-piece customer requirement and permits use of a modular end-to-end stackable flexible connector system approach.

The connector organizer and board stiffener of the present invention includes a L-shaped metallic strip with openings designed to produce an interference fit with locating pegs extending from underneath the housing body of a thermoplastic connector housing. This connector housing system, explicitly designed for modularity with end-to-end stackability has these locating pegs located in a repeating pattern that correspond to the end-to-end stacking modularity of the connector. The openings on the board stiffener are also repeating and spaced apart a set distance that corresponds to the end-to-end modular stacking distance of the connector system. This configuration allows for different modules to be assembled together on the strip, side by side, and held together and handled as one "assembly". This one-piece assembly can then be easily fitted flush to the surface of a PCB having an edge which has been trimmed by an amount equal to the thickness of the L-shaped strip. Connectors can then be fastened to the PCB in a traditional manner, without any additional assembly step required by the customer to apply a board stiffener. The edge trimming operation of the PCB can be easily accommodated during PCB manufacture.

The apparatus of the present invention permits the connector manufacturer the flexibility to assemble a multitude of connector configurations, supplying his customers a "one-piece solution", yet it eliminates the need to develop dedicated, expensive tooling. In addition, the apparatus serves the dual purpose of reinforcing the strength of the PCB, greatly reducing the potential of bow or warpage, and in effect acting as a board stiffener. By virtue of being underneath the connector, the apparatus of the present invention requires no additional PCB real estate that otherwise could have been allocated to IC logic circuitry. Conventional connector organizers and/or board stiffeners require individual assembly and take up valuable board real estate behind the connector.

The closer that IC circuitry can be placed to the edge of a PCB in a backplane system, the shorter the signal propagation delay on the system. This is a very important criteria for high-speed systems. The apparatus of the present invention advantageously provides improved electrical performance, low applied costs, maximum flexibility and compatibility with a modular design, board reinforcement, and inexpensive manufacturing.

According to one aspect of the present invention, an apparatus is configured to be positioned between an electrical connector and a printed circuit board to strengthen the printed circuit board. The electrical connector has at least one location peg extending therefrom for aligning the electrical connector relative to the printed circuit board. The apparatus includes a generally L-shaped body member having a first leg configured to abut an end edge of the printed circuit board and a second leg configured to abut a surface of the printed circuit board adjacent the end edge. The second leg is formed to include at least one aperture for receiving the at least one location peg of the electrical connector therein to couple electrical connector to the body member.

In the illustrated embodiment, the printed circuit board is formed to include a notched portion adjacent the end edge. The second leg of the L-shaped body member is configured to lie within the notched portion.

The electrical connector includes at least one fixing stud for securing the connector to the printed circuit board. The second leg is formed to include at least one fixing stud aperture to permit the at least one fixing stud to pass through the body member to secure the electrical connector and the body member to the printed circuit board.

According to another aspect of the present invention, an apparatus is configured to be positioned between an electrical connector and a printed circuit board to strengthen the printed circuit board. The printed circuit board has a top surface and is formed to include a notched portion having predetermined depth below the top surface. The electrical connector has at least one location peg extending therefrom to align the connector relative the printed circuit board. The apparatus includes a body member having a thickness substantially equal to the predetermined depth. The body member is configured to be positioned in the notched portion so that a top surface of the body member is substantially coplanar with the top surface of the printed circuit board. The body member is also formed to include at least one aperture for receiving the at least one location peg of an electrical connector therein.

According to yet another aspect of the present invention, an apparatus is provided for organizing a plurality of modular electrical connectors for attachment to a printed circuit board. The plurality of electrical connectors each have at least one fixing stud for securing the connectors to the printed circuit board and at least one location peg to align the electrical connectors relative the printed circuit board. The apparatus includes a body member formed to include a first set of apertures sized to permit the fixing studs to pass therethrough to secure the electrical connector and the body member to the printed circuit board and a second set of apertures configured to engage the location pegs to couple the connectors to the body member. The first and second sets of apertures are arranged in a predetermined pattern to permit a plurality of modular electrical connectors to be mounted end-to-end on the body member prior to coupling the modular electrical connectors and the body member to the printed circuit board.

Additional objects, features, and advantages of the invention will become apparent to those skilled in the art upon consideration of the following detailed description of a preferred embodiment exemplifying the best mode of carrying out the invention as presently perceived.

BRIEF DESCRIPTION OF THE DRAWINGS

The detailed description particularly refers to the accompanying figures in which.

DETAILED DESCRIPTION OF THE DRAWINGS

Figure 1:
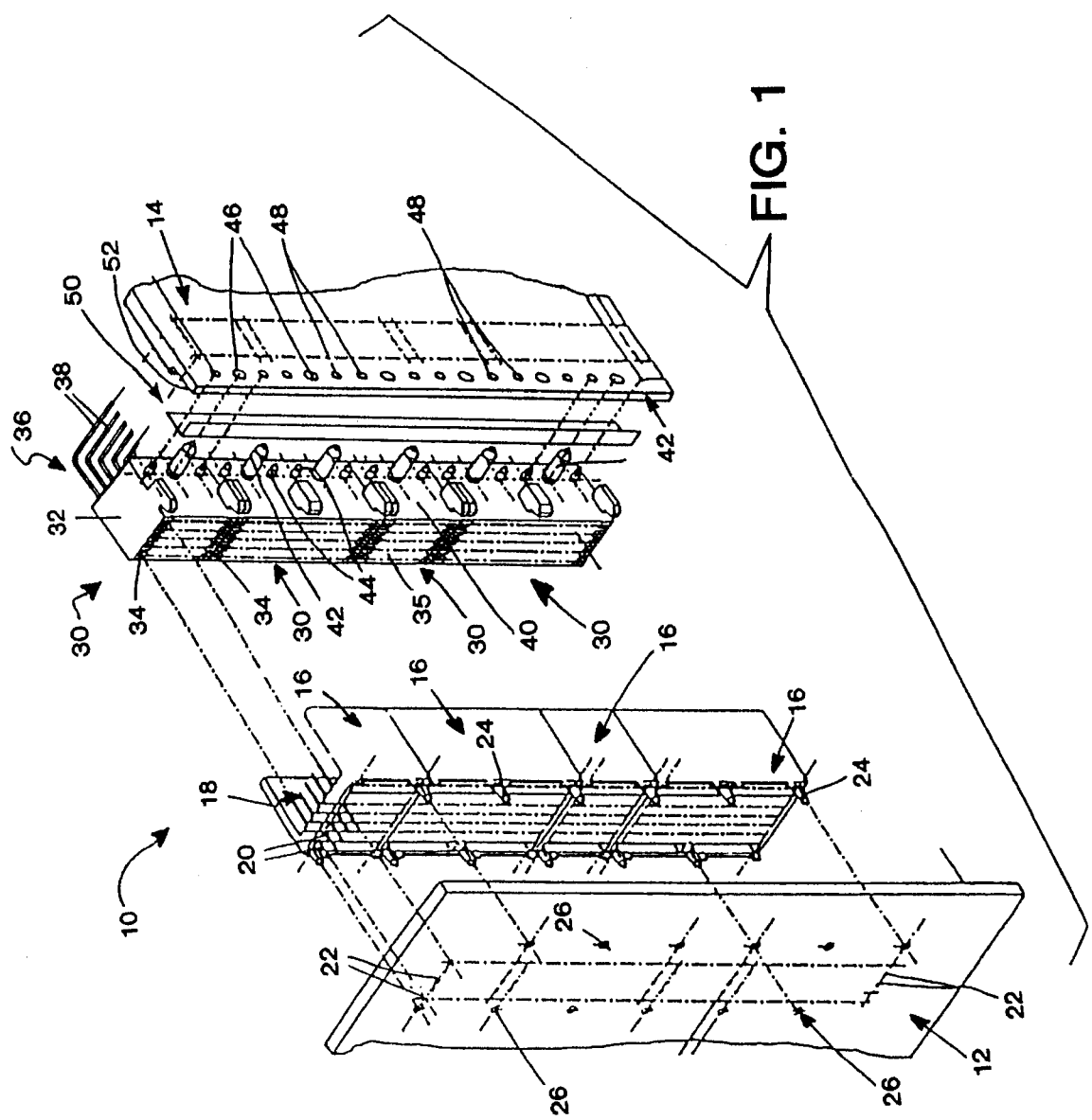
FIG. 1 is an exploded perspective view of a two part modular connector system for electrically coupling a backplane or motherboard to a daughtercard, including a plurality of free board connectors having female receptacle contacts, plurality of fixed board connectors that contain male pin contacts configured to be coupled to the motherboard, and a board stiffener of the present invention configured to be coupled between the daughtercard and the printed circuit board.

Referring now to the drawings, FIG. 1 illustrates a two-part modular connector system 10 for electrically coupling a backplane printed circuit board ("PCB") or motherboard 12 to a daughtercard PCB 14. FIG. 1 also illustrates a plurality of fixed connectors 16 configured to be electrically coupled to motherboard 12. Fixed board electrical connectors 16 each include a plurality of male pin contacts 18 having contact leads 20 configured to extend through an array of apertures 22 formed in motherboard 12. Apertures 22 are typically covered with an electrically conductive material to electrically couple fixed board connectors 16 to motherboard 12. Fixed board connectors 16 also include alignment pegs 24 configured to enter apertures 26 formed in motherboard 12 to align fixed board connector 16 relative to motherboard 12. Pegs 24 are heat staked to couple connectors 16 to motherboard 12.

FIG. 1 also illustrates a plurality of right angle female connectors 30 configured to be electrically coupled to daughtercard 14. Connectors 30 includes a thermoplastic insulated housing 32 formed to include a plurality of pin insertion windows 34. Pin insertion windows 34 are formed in top surface 35 for receiving pins 18 of connectors 16 therein. Female receptacle contacts 36 located within housing 32 are aligned with each pin insertion window 34. Preferably, female contacts 36 include dual beam receptacle contacts (not shown) and a tail 38 for electrically coupling contacts 36 to daughtercard 14.

Each connector housing 32 includes a bottom surface 40 having a set of fixing studs 42 extending therefrom. Bottom surface 40 also includes a set of alignment or location pegs 44 extending therefrom. Fixing studs 42 are configured to enter a first set of holes 46 formed in daughtercard 14. Fixing studs 42 are deformed by applying a heat tool head (not shown) to provide mechanical attachment of the connectors 30 to daughtercard 14. The location pegs 44 are configured to enter a second set of apertures 48 formed in daughtercard printed circuit board 14. Location pegs 44 therefor prevent wrong assembly and provide accurate positioning of connectors 30 on daughtercard printed circuit board 14.

As discussed above, customers desire a single housing connector capable of extending long distances along the edge of a PCB. However, tooling costs for such long connector housings are prohibitive. Therefore, modular connectors such as connectors 16 and 30 illustrated in FIG. 1 have been designed to permit end-to-end stackability of adjacent connectors. Therefore, customers can select connectors 16 and 30 having different sizes and stack those connectors end-to-end to effectively provide a single connector housing of a desired length. The connector organizer and board stiffener apparatus advantageously permits such modular end-to-end stackability of adjacent connectors 16 and 30 without taking up additional real estate on daughtercard 14 and without providing increased assembly costs for a separate add-on board stiffener.

Figure 2:
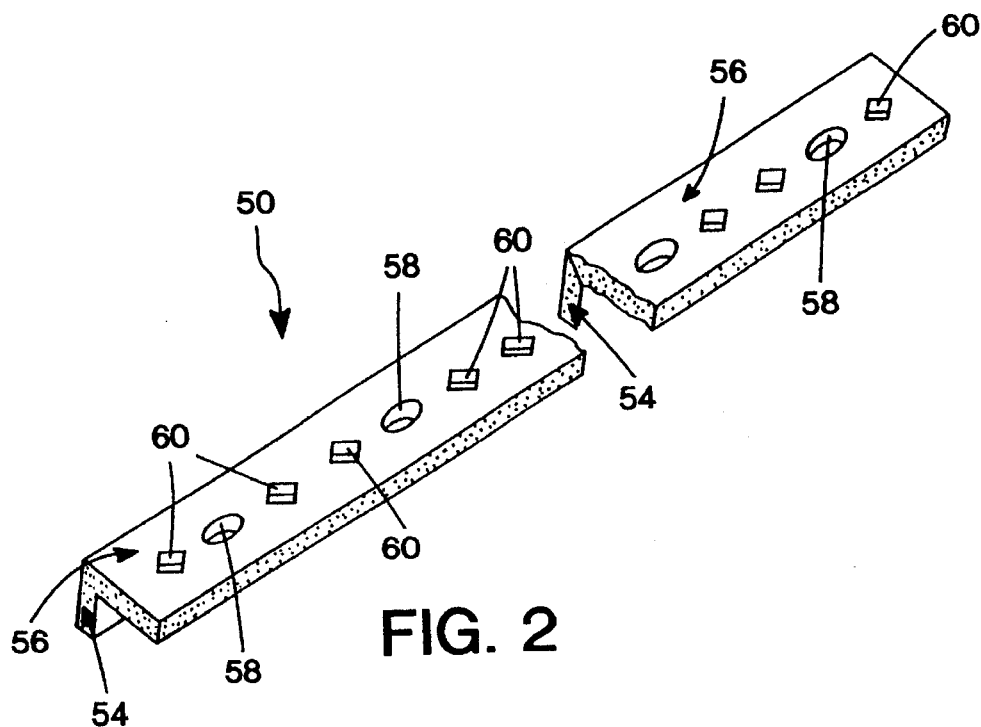
FIG. 2 is a perspective view of the connector organizer and board stiffener apparatus of the present invention.

The board stiffener 50 of the present invention is configured to be coupled between daughtercard 14 and connectors 30 in a notched section 52 of daughtercard 14. FIG. 2 illustrates board stiffener 50 of the present invention in more detail. Board stiffener 50 is a generally L-shaped metallic part including a first leg section 54 and a second leg section 56. Second leg section 56 is formed to include a plurality of longitudinally spaced apertures 58 configured to receive the fixing studs 42 of connectors 30 therethrough. The first set of apertures 58 is aligned with the apertures 46 in daughtercard 14. Therefore, fixing studs 42 extend through apertures 58 in board stiffener 50 and through apertures 46 in daughtercard 14. Second leg 56 of board stiffener 50 is also formed to include a second set of apertures 60 configured to receive location pegs 44 of connector 30 therein. Apertures 60 are aligned with apertures 48 in daughtercard 14. Apertures 60 are configured to provide an interference fit with alignment pegs 44 to couple connectors 30 to board stiffener 50.

The arrangement of first set of apertures 58 and second set of apertures 60 in board stiffener 50 permits the use of board stiffener 50 with the modular end-to-end stackable connectors 30. As discussed above, connectors 30 include location pegs 44 located in a repeating pattern that correspond to the end-to-end stacking modularity of the connector. The first and second sets of apertures 58 and 60 are repeating and spaced apart predetermined distances that correspond to the end-to-end modular stacking distance of the fixing studs 42 and location pegs 44 on conventional connectors 30. Accordingly, different sized connector modules 30 can be preassembled by coupling the connectors 30 to board stiffener 50 in a side-by-side relationship. Such connectors 30 are held together and handled as one "assembly" coupled to board stiffener 50. This facilitates installation and handling of the connectors 30. The entire assembly including board stiffener 50 and the attached connectors 30 are then fitted into notch section 52 of daughtercard 14. Notched section 52 is formed by edge trimming daughtercard 14 during the manufacture of daughtercard 14. Connectors 30 are then fastened to daughtercard 14 in a traditional manner. For example, fixing studs 42 can be heat staked as illustrated at location 61 of FIG. 3 to secure connectors 30 to daughtercard 14. Coupling of board stiffener 50 and connectors 30 to daughtercard 14 is advantageously provided without any additional assembly step required by the customer to apply board stiffener 50. In addition, since board stiffener 50 fits in notched section 52, no additional real estate is required to couple board stiffener 50 to daughtercard 14.

It is understood that other methods of mechanically coupling connectors 30 to daughtercard 14 may be provided. For instance, various type of hold down anchor apparatus may be used to secure connectors 30 to daughtercard 14. For example, the first set of apertures 58 formed in board stiffener 50 may be sized to receive a plurality of spaced anchoring apparatus extending from bottom surface 40 of connectors 30. See, for example, U.S. Pat. No. 5,401,187 to Ortega, owned by the same assignee as the present invention, describing an electrical connector hold down anchor apparatus which may be used to secure connectors 30 to daughtercard 14.

Figure 3:
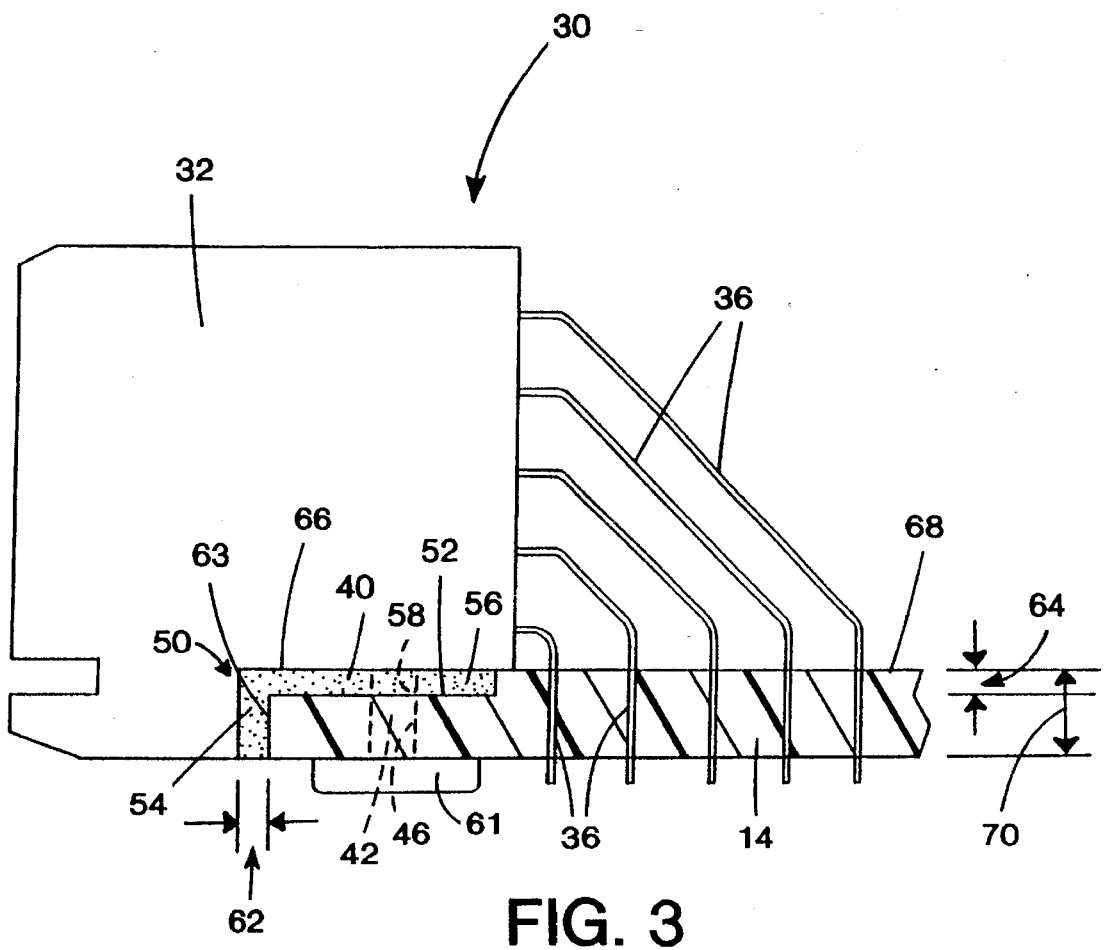
FIG. 3 is a partial sectional view illustrating the free board connector coupled to the printed circuit board and the connector organizer and board stiffener apparatus of the present invention coupled therebetween.

FIG. 3 illustrates connectors 30 installed onto daughtercard printed circuit board 14. Leads 36 of connectors 30 extend through daughtercard 14 to electrically couple connector 30 to daughtercard 14. As illustrated in FIG. 3, first leg 54 of board stiffener 50 has a thickness equal to about 0.75 mm as illustrated by dimension 62. First leg 54 abuts end edge 63 of daughtercard 14. Second leg 56 of board stiffener 50 also has a thickness equal to about 0.75 mm as illustrated by dimension 64. The notched section 52 formed in daughtercard 14 has a depth of about 0.75 mm so that a top surface 66 of second side leg 56 is substantially coplanar with a top surface 68 of daughtercard 14. Therefore, the overall thickness of the entire daughtercard 14 including the portion on which board stiffener 50 is mounted remains at about 2.36 mm as illustrated by dimension 70.

Accordingly, board stiffener 50 of the present invention advantageously provides an integrated connector organizer which permits modular electrical connectors 30 to be preassembled onto board stiffener 50. In addition, board stiffener 50 can be coupled between connectors 30 and daughtercard 14 to substantially reduce board warpage that may occur as connectors 30 and daughtercard 14 are heated during the soldering phase. Therefore, the apparatus of the present invention provides an integrated electrical connector organizer and board stiffener which can be easily mounted between the connectors 30 and a daughtercard 14 without using any additional daughtercard 14 real estate than is used with connectors 30 alone. The board stiffener 50 of the present invention provides improved electrical performance, low applied cost, and permits maximum flexibility for compatibility with modular designs. In addition, board stiffener 50 is inexpensive to manufacture.

It is understood that in some instances a rectangular body member may be used instead of the L-shaped body member. Also in some instances, notched section 52 may be spaced apart from end edge 63.

Although the invention has been described in detail with reference to a certain preferred embodiment, variations and modifications exist within the scope and spirit of the invention as described and defined in the following claims.

What is claimed is:

1. An apparatus configured to be positioned between an electrical connector and a printed circuit board to strengthen the printed circuit board, the electrical connector having at least one location peg extending therefrom for aligning the electrical connector relative to the printed circuit board, the apparatus comprising a generally L-shaped body member having a first leg configured to abut an end edge of the printed circuit board and a second leg configured to abut a surface of the printed circuit board adjacent the end edge, the second leg being formed to include at least one aperture for receiving the at least one location peg of the electrical connector therein to couple electrical connector to the body member.

2. The apparatus of claim 1, wherein the printed circuit board is formed to include a notched portion adjacent the end edge, and the second leg of the L-shaped body member is configured to lie within the notched portion.

3. The apparatus of claim 1, wherein the printed circuit board has a top surface and is formed to include a notched portion formed adjacent the end edge, the notched portion having predetermined depth below the top surface of the printed circuit board, and the second leg of the L-shaped body member having a thickness substantially equal to the predetermined depth, the second leg being configured to be positioned in the notched portion so that a top surface of the second leg is substantially coplanar with the top surface of the printed circuit board to strengthen and prevent warpage of the printed circuit board.

4. The apparatus of claim 1, wherein the electrical connector includes at least one fixing stud for securing the connector to the printed circuit board, and the second leg is formed to include at least one fixing stud aperture to permit the at least one fixing stud to pass through the body member to secure the electrical connector and the body member to the printed circuit board.

5. The apparatus of claim 1, wherein the electrical connector includes a plurality of fixing studs for securing the connector to the printed circuit board and a plurality of location pegs to align the connector relative the printed circuit board, and the second leg of the L-shaped body member is formed to include a first set of apertures for receiving the fixing studs which pass through the body member and engage the printed circuit board and a second set of apertures for providing an interference fit with the location pegs on the electrical connector.

6. The apparatus of claim 1, wherein the electrical connector includes at least one fixing stud for securing the connector to the printed circuit board, and the second leg of the L-shaped body member is formed to include a first set of apertures to permit fixing studs to pass through the body member to secure the electrical connector and the body member to the printed circuit board and a second set of apertures which provide an interference fit with location pegs, the first and second sets of apertures being arranged in a predetermined pattern to permit a plurality of modular electrical connectors having fixing studs and location pegs to be mounted end-to-end on the body member prior to coupling the modular electrical connectors and the body member to the printed circuit board.

7. The apparatus of claim 1, wherein the body member is made from a metallic material.

8. An apparatus configured to be positioned between an electrical connector and a printed circuit board to strengthen the printed circuit board, the printed circuit board having a top surface and being formed to include a notched portion having predetermined depth below the top surface, the electrical connector having at least one location peg extending therefrom to align the connector relative the printed circuit board, the apparatus comprising a body member having a thickness substantially equal to the predetermined depth, the body member being configured to be positioned in the notched portion so that a top surface of the body member is substantially coplanar with the top surface of the printed circuit board, the body member being formed to include at least one aperture for receiving the at least one location peg of an electrical connector therein.

9. The apparatus of claim 8, wherein the body member is generally L-shaped and has a first leg configured to abut the end edge of the printed circuit board and a second leg configured to lie within the notched portion of the printed circuit board formed adjacent the end edge.

10. The apparatus of claim 8, wherein the electrical connector includes at least one fixing stud for securing the connector to the printed circuit board, and the body member is formed to include at least one fixing stud aperture to permit the at least one fixing stud to pass through the body member to secure the electrical connector and the body member to the printed circuit board.

11. The apparatus of claim 8, wherein the electrical connector includes a plurality of fixing studs for securing the connector to the printed circuit board and a plurality of location pegs to align the connector relative the printed circuit board, and the body member is formed to include a first set of apertures for receiving the fixing studs which pass through the body member and engage the printed circuit board and a second set of apertures for providing an interference fit with the location pegs on the electrical connector.

12. The apparatus of claim 8, wherein the electrical connector includes at least one fixing stud for securing the connector to the printed circuit board, and the body member is formed to include a first set of apertures to permit fixing studs to pass through the body member to secure the electrical connector and the body member to the printed circuit board and a second set of apertures which provide an interference fit with the at least one location peg on the electrical connector, the first and second sets of apertures being arranged in a predetermined pattern to permit a plurality of modular electrical connectors having fixing studs and location pegs to be mounted end-to-end on the body member prior to coupling the modular electrical connectors and the body member to the printed circuit board.

13. The apparatus of claim 8, wherein the body member is made from a metallic material.

14. An apparatus for organizing a plurality of modular electrical connectors for attachment to a printed circuit board, the plurality of electrical connectors each having at least one fixing stud for securing the connectors to the printed circuit board and at least one location peg to align the electrical connectors relative the printed circuit board, the apparatus comprising a generally L-shaped body member having a first leg configured to abut an end edge of the printed circuit board and a second leg configured to abut a surface of the printed circuit board adjacent the end edge, the second leg of the body member being formed to include a first set of apertures sized to permit the fixing studs to pass therethrough to secure the electrical connector and the body member to the printed circuit board, and the second leg also being formed to include a second set of apertures configured to engage the location pegs to couple the connectors to the body member, the first and second sets of apertures being arranged in a predetermined pattern to permit a plurality of modular electrical connectors to be mounted end-to-end on the body member prior to coupling the modular electrical connectors and the body member to the printed circuit board.

15. The apparatus of claim 14, wherein the body member is made from a metallic material.

16. An apparatus for organizing a plurality of modular electrical connectors for attachment to a printed circuit board, the plurality of electrical connectors each having at least one fixing stud for securing the connectors to the printed circuit board and at least one location peg to align the electrical connectors relative the printed circuit board, the printed circuit board having a top surface formed to include a notched portion adjacent an end edge of the printed circuit board, the notched portion having predetermined depth below the top surface, the apparatus comprising a body member, the body member having a thickness substantially equal to the predetermined depth, the body being configured to be positioned in the notched portion so that a top surface of the body member is substantially coplanar with the top surface of the printed circuit board to strengthen and prevent warpage of the printed circuit board, the body member being formed to include a first set of apertures sized to permit the fixing studs to pass therethrough to secure the electrical connector and the body member to the printed circuit board and a second set of apertures configured to engage the location pegs to couple the connectors to the body member, the first and second sets of apertures being arranged in a predetermined pattern to permit a plurality of modular electrical connectors to be mounted end-to-end on the body member prior to coupling the modular electrical connectors and the body member to the printed circuit board.

17. The apparatus of claim 16, wherein the body member is generally L-shaped and has a first leg configured to abut the end edge of the printed circuit board and a second leg configured to lie within the notched portion, the second leg being formed to include the first and second sets of apertures therein.

* * * * *